United States Patent
Leu et al.

(10) Patent No.: US 8,242,372 B2
(45) Date of Patent: Aug. 14, 2012

(54) THERMALLY CONDUCTIVE, ELECTRICALLY INSULATING COMPOSITE FILM AND STACK CHIP PACKAGE STRUCTURE UTILIZING THE SAME

(75) Inventors: Ming-Sheng Leu, Hsinchu County (TW); Chun-Kai Liu, Taipei (TW); Jenn-Dong Hwang, Hsinchu (TW); Jin-Bao Wu, Hsinchu (TW); Chih-Kuang Yu, Chiayi (TW)

(73) Assignee: Industrial Technology Research Institute, Hsinchu (TW)

( * ) Notice: Subject to any disclaimer, the term of this patent is extended or adjusted under 35 U.S.C. 154(b) by 127 days.

(21) Appl. No.: 12/835,716

(22) Filed: Jul. 13, 2010

(65) Prior Publication Data

US 2011/0149521 A1 Jun. 23, 2011

(30) Foreign Application Priority Data

Dec. 23, 2009 (TW) .............................. 98144432 A

(51) Int. Cl.
*H05K 1/00* (2006.01)
(52) U.S. Cl. ...................... 174/252; 174/255; 174/126.2; 361/710; 361/712; 361/713; 361/719; 361/722; 428/408; 428/612
(58) Field of Classification Search .................. 361/704, 361/707, 709–713, 717, 719–722; 174/34, 174/68.1, 252, 255, 258, 260, 262, 394, 113 R, 174/126.1, 126.2
See application file for complete search history.

(56) References Cited

U.S. PATENT DOCUMENTS

| | | | | |
|---|---|---|---|---|
| 4,812,792 A * | 3/1989 | Leibowitz | | 333/238 |
| 5,100,737 A * | 3/1992 | Colombier et al. | | 428/612 |
| 6,027,807 A * | 2/2000 | Inoue et al. | | 428/408 |
| 6,525,943 B2 | 2/2003 | Moden et al. | | |
| 6,540,525 B1 * | 4/2003 | Li et al. | | 439/66 |
| 6,566,746 B2 | 5/2003 | Isaak et al. | | |
| 6,849,480 B1 | 2/2005 | Low et al. | | |
| 6,878,571 B2 | 4/2005 | Isaak et al. | | |
| 7,119,428 B2 | 10/2006 | Tanie et al. | | |
| 7,190,068 B2 | 3/2007 | Hackitt et al. | | |
| 7,291,396 B2 * | 11/2007 | Huang et al. | | 428/408 |
| 7,846,506 B1 * | 12/2010 | Bhattacharya et al. | | 427/404 |
| 2001/0048698 A1 * | 12/2001 | Lorenzen et al. | | 372/36 |
| 2006/0261470 A1 * | 11/2006 | Schick | | 257/718 |
| 2008/0239675 A1 * | 10/2008 | Speier | | 361/712 |
| 2008/0265403 A1 * | 10/2008 | Cornie et al. | | 257/706 |
| 2011/0018566 A1 * | 1/2011 | Crafts et al. | | 324/754.07 |

FOREIGN PATENT DOCUMENTS

| | | |
|---|---|---|
| WO | WO 00/68996 | 11/2000 |
| WO | WO 2004/015775 A1 | 2/2004 |

OTHER PUBLICATIONS

Ken Goodson, "On-Chip Thermal Engineering", Oct. 25-27, 2004, 34 pages, International Sematech, US.

* cited by examiner

*Primary Examiner* — Courtney Smith

(57) ABSTRACT

Disclosed is a thermally conductive, electrically insulating composite film, including interface layers disposed on the top and bottom surface of a metal substrate, and an insulation layer. Because the film has thermal conductivity and electric insulation properties, it can be disposed between the chips of a stack chip package structure, thereby dissipating the heat in horizontal and vertical directions simultaneously.

20 Claims, 3 Drawing Sheets

THERMALLY CONDUCTIVE, ELECTRICALLY INSULATING COMPOSITE FILM AND STACK CHIP PACKAGE STRUCTURE UTILIZING THE SAME

CROSS REFERENCE TO RELATED APPLICATIONS

This Application claims priority of Taiwan Patent Application No. 98144432, filed on Dec. 23, 2009, the entirety of which is incorporated by reference herein.

BACKGROUND OF THE INVENTION

1. Field of the Invention

The present invention relates to a thermally conductive, electrically insulating composite film, and in particular relates to a stack chip package structure utilizing the same.

2. Description of the Related Art

Heat density is continuously increased with the enhancement of chip efficiency. According to the prediction of ITRS and iNEMI, low cost devices, cost-performance devices, and high performance devices will face serious challenges relating to thermal management of their electronic components. Taking cost-performance devices as an example, their heating density is estimated to be about 85 W/cm$^2$. When the process critical dimension progresses to 14 nm, the device power density will be increased to over 100 W/cm$^2$, and the device junction to ambient will be less than 0.2° C./W, which causes a bottleneck in practical application. Moreover, hot spots create problems as a result of uneven thermal dissipation of the chip. This problem becomes worse as heat accumulates. According to reports from Intel, IBM and Fujitsu, the thermal conductivity of the devices is dramatically enhanced by the hot spots, and it is desirable to reduce the thermal resistance of the thermal dissipation devices by one-third to one-fifth.

Most of the conventional thermal dissipation methods depend on top heat spreaders, wherein the hot spots are evenly dissipated and then removed by coolers. However, the hot spot problems in stack chip package structures are even more severe. Especially when the chips generating heat are stacked in the middle of the stack structure, it is difficult to conduct heat to ambient levels. The accumulated heat will influence the periphery chips and reduce the devices' reliability.

Accordingly, the need exists for a novel thermal conductive structure which will improve thermal conductivity without changing the current production process and driving up costs.

BRIEF SUMMARY OF THE INVENTION

The invention provides a thermally conductive, electrically insulating composite film, comprising: a metal substrate; interface layer disposed on the top surface and the bottom surface of the metal substrate, respectively; and first insulation layers on the interface layers.

The invention also provides a stack chip package structure, comprising: a carrier substrate; a plurality of vertically stacked chips disposed on the carrier substrate, wherein the chips have contact holes; and the described composite film disposed between the chips and/or between the chips and the carrier substrate; wherein the contact holes and the carrier substrate are connected by bumps, and the bumps contact the composite film.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Because the stack chip package structure encounters the serious problem of heat accumulation, it requires more thermal dissipation paths in a limited space. Designing an effective thermal dissipation method for the chips is an important concept of 3D-ICs. According to the simulation, high thermally conductive material greatly increases thermal dissipation of the 3D-ICs. In general, the space between the chips are largely disposed with the gel material (K<1 W/mK) and also partially disposed with bumps. When the hot spots increase and generate high heat, the number of the bumps must also be increased in order to increasing heat dissipation. One solution to overcome the above problem is adopting spacers having a thickness less than 100 μm and thermal conductivity greater than 100 W/mK. The spacers can be collocated with the chips to reduce problems such as hot spots and heat accumulation of the stack chip package structure. Because the spacer (interface layer) may contact conductors of the chips, the surface of the spacer should be electrically insulated to avoid short circuits. The conventional copper or aluminum foils have good thermal conductivity, however, they are not electrically insulating, and therefore these metal foils are not suitable as an interface layer for the 3D-ICs. The invention provides a high thermally conductive, electrically insulating composite layer, composed of a diamond like carbon layer and an insulation layer, formed on the surface of the aluminum or copper foil to complete a composite film. Therefore, the composite film may fill the space between the chips of the 3D-ICs. The thermal conductivity of the described composite film is similar to the copper foil. Furthermore, the composite film is electrically insulating and flexible. In one embodiment, the composite film has a thickness of 10 μm to 500 μm.

Figure 1:
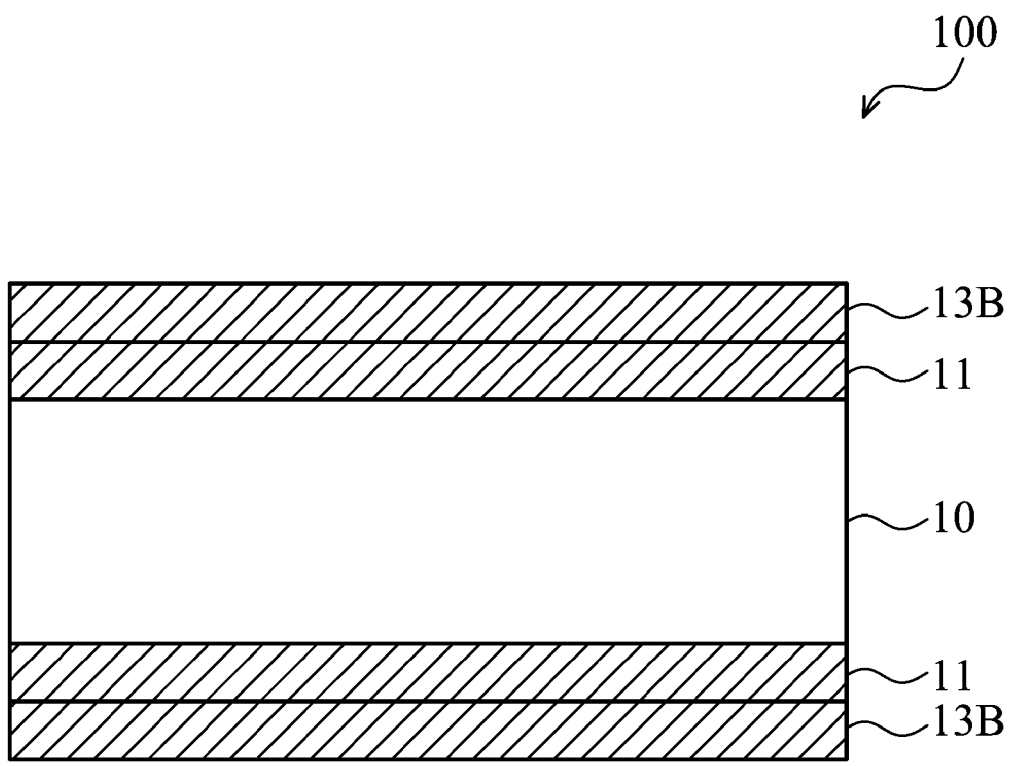
FIG. 1 is cross section of a thermally conductive, electrically insulating composite film in one embodiment of the invention.

As shown in FIG. 1, the metal substrate 10 is provided. The metal substrate 10 can be selected from high thermally conductive metals such as aluminum, copper, and the likes. The metal substrate serves as a thermal fluid channel which quickly dissipates heat from hot spots. In one embodiment, the metal substrate 10 has a thickness of 10 μm to 200 μm. The excessively thin metal substrate 10 is non-flexible, does not provide sufficient support and will increase costs.

Subsequently, the interface layers 11 are formed on the top and bottom surfaces of the metal substrate 10, respectively. The interface layer 11 can be aluminum or aluminum nitride, and can be formed by PVD such as vacuum sputtering or electric arc ion deposition. For example, the aluminum target is applied a bias voltage of 0V to −500V under a pressure of $10^{-4}$ Pa to 2 Pa in an inert gas such as He, Ne, Ar, Kr, or Xe to grow an aluminum layer on the metal substrate 10. In an alternative method, the inert gas is replaced by nitrogen to grow an aluminum nitride layer on the metal substrate 10. The interface layer 11 functions to increase the bonding strength between the metal substrate and the outermost insulation layer. In one embodiment, the interface layer 11 has a thickness of 20 nm to 100 nm. The excessively thin interface layer 11 will cause the bonding strength to weaken, and the excessively thick interface layer 11 will increase the target cost without increasing the bonding strength.

Subsequently, the insulation layer 13B is formed on the interface layer 11 to complete the thermally conductive, electrically insulating composite film 100. The insulation layer 13B includes aluminum oxide and aluminum nitride, and can be formed by PVD. The insulation layer 13B functions to prevent a short circuit when the chips contact the thermally conductive, electrically insulating composite film 100. In one embodiment, the insulation layer 13B has a thickness of 20 nm to 2 μm. The excessively thin insulation layer 13B cannot provide effective electric insulation, and the excessively thick insulation layer 13B will reduce the thermal conductivity of the composite film.

Figure 2:
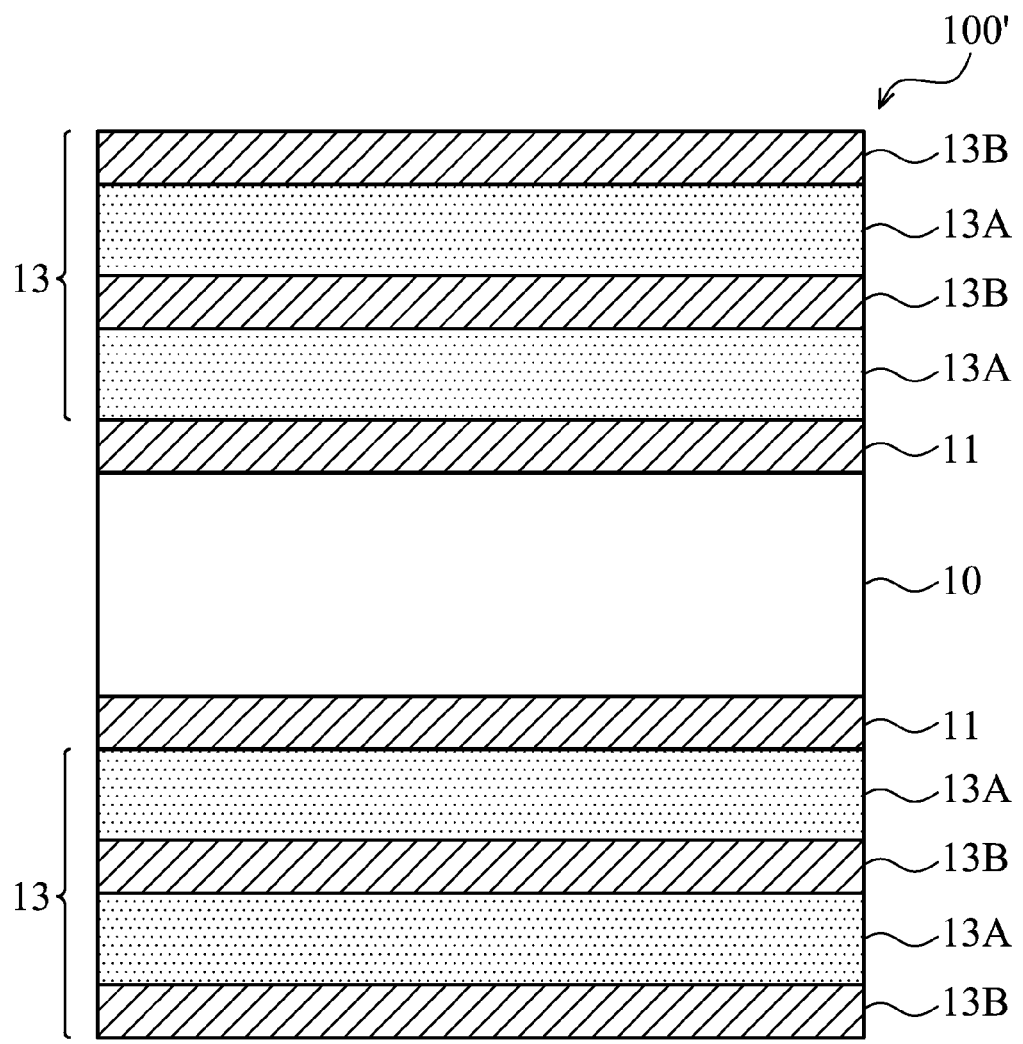
FIG. 2 is cross section of another thermally conductive, electrically insulating composite film in one embodiment of the invention.

FIG. 2 shows the thermally conductive, electrically insulating composite film 100' in another embodiment of the invention. The metal substrate 10 is first provided, wherein the top and bottom surfaces of the metal substrate have the interface layer 11, respectively. The material and formation of the metal substrate 10 and the interface layer 11 are similar to the embodiment described above and therefore omitted here. Thereafter, the diamond like carbon (DLC) layer 13A is formed on the interface layer 11. The diamond like carbon layer includes pure carbon or tetragonal amphormous carbon doped with hydrogen, nitrogen, or metal atoms, wherein the doping ratio is less than 10%. The diamond like carbon layer 13A mat be formed by PVD. The diamond like carbon layer functions to quickly conduct heat in both the vertical direction and horizontal direction. In one embodiment, the diamond like carbon layer 13A has a thickness of 100 nm to 10 μm. The excessively thin diamond like carbon layer 13A cannot efficiently conduct heat, and the overly thick diamond like carbon layer 13A will not efficiently improve the thermal conductivity of the composite film and be easily peeled off due to stress accumulation.

Another insulation layer 13B is then formed on the diamond like carbon layer 13A. The insulation layer 13B includes aluminum oxide or aluminum nitride, and it is formed by PVD. The insulation layer 13B functions to prevent a short circuit when the chips contact the thermally conductive, electrically insulating composite film 100. In one embodiment, the insulation layer 13B has a thickness of 20 nm to 2 μm. The overly thin insulation layer 13B cannot provide effective electric insulation, and the overly thick insulation layer 13B will reduce the thermal conductivity of the composite film.

The composite layer 13 is composed of the diamond like carbon layer 13A and the insulation layer 13B. In one embodiment, the composite layer 13 only includes one diamond like carbon like layer 13A and one insulation layer 13B, wherein the insulation layer 13B is the outermost layer. In other embodiments, another diamond like carbon layer 13A and another insulation layer 13B can be alternately formed on the insulation layer 13B. In other words, the composite layer 13 may include a plurality of diamond like carbon layer 13A and the insulation layer 13B in alternately arrangement. Note that whatever the number of the diamond like carbon layers 13A and insulation layers 13B, the outermost layer must always be an insulation layer 13B in order to avoid a short circuit due to contact between the diamond like carbon layer 13A and the chips when the composite film is disposed between the chips. As such, the thermally conductive, electrically insulating composite film 100' is obtained.

Figure 3:
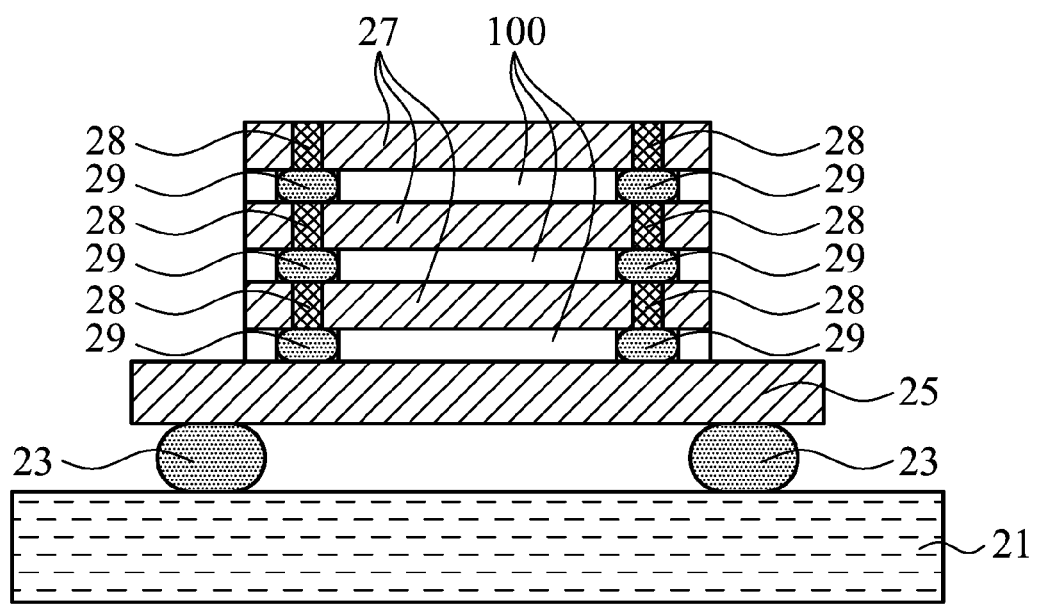
FIG. 3 is cross section of a stack chip package structure in one embodiment of the invention.

The described thermally conductive, electrically insulating composite films 100 and 100' can be applied in stack chip package structures. As shown in FIG. 3, the circuit board 21 is connected to the carrier substrate 25 by the solder balls 23. The carrier substrate 25 includes copper, aluminum, or other high thermally conductive materials. The thermally conductive, electrically insulating composite films 100 or 100' are cut to fit the chip size, and then punched or mechanically drilled to form predetermined spaces for the bumps 29. Subsequently, the thermally conductive, electrically insulating composite film 100 or 100' is disposed on the carrier substrate 25, the bumps 25 are then formed in the predetermined spaces, and the chip 27 is pressed on the composite film 100 or 100', such that the contact holes 28 of the chip 27 contact the bumps 29. The material of the contact holes 28 and the bumps 29 can be copper, aluminum, or other high thermal conductive metals. Subsequently, another composite film 100 or 100' is disposed on the chip 27, other bumps 29 are formed in the predetermined space, and another chip 27 is pressed on the composite film 100 or 100'. The structure in FIG. 3 is obtained by repeating the described steps, wherein the contact holes 28 of the chips 27 and the carrier substrate 25 are connected by the bumps 29, and the bumps 29 contact the composite film 100 or 100'. Accordingly, the heat generated by the chips 27 may transfer to the composite film 100, and further transfer to the bumps 29 in horizontal direction. The heat transferred to the bumps 29 can be quickly transferred to the carrier substrate 25 through the contact holes of the chips and the other bumps. In one embodiment, other common thermal dissipation components such as fan, heat pipe, or combinations thereof are further disposed on the sidewall or the top of the stack chip package structure, thereby improving the thermal dissipation efficiency of the stack chip package structure.

EXAMPLES

The sheet electrical resistance of the composite films in Examples was measured by a four-point probe. The thermal conductivity of the films was measured by TPS 2500 system commercially available from Hot Disk Co. Sweden (ISO-DIS22007). The measurement was based on a transient plane source method, wherein the probe temperature was enhanced when the current passed through the nickel probe, and the heat dissipated from the probe to the sample. The heat dissipation speed was determined by the thermal conductivity of the sample. Accordingly, the thermal conductivity of the sample can be calculated by the temperature curve and the probe response period.

Example 1

A copper foil of 5 cm*15 cm*200 μm was charged in a vacuum chamber, and an aluminum layer of 70 nm thickness was sputtered on the top and bottom surfaces of the copper foil by PVD. Subsequently, a diamond like carbon layer of 800 nm thickness and an aluminum nitride layer of 650 nm thickness were sequentially formed on the aluminum layer, such that a thermally conductive, electrically insulating composite film was obtained. The thermally conductive, electrically insulating composite film had a thermal conductivity of 367 W/mK and a sheet electrical resistance higher than $10^8\Omega$-cm as measured by the described method. The measurement results indicate that the composite film was thermally conductive and electrically insulating, and can be disposed between the stacked chips without causing a short circuit.

Example 2

A copper foil of 5 cm*15 cm*200 μm was charged in a nitrogen chamber, and an aluminum nitride layer of 50 nm thickness was sputtered on the top and bottom surfaces of the copper foil by PVD. Subsequently, a diamond like carbon layer of 200 nm thickness, an aluminum nitride layer of 200 nm thickness, a carbon like layer of 400 nm thickness, and an aluminum nitride layer of 300 nm thickness were sequentially formed on the aluminum nitride layer, such that the thermally conductive, electrically insulating composite film was obtained. The thermally conductive, electrically insulating composite film had a thermal conductivity of 223 W/mK and a sheet electrical resistance higher than $10^8\Omega$-cm as measured by the described method. The measurement results indicate that the composite film was thermally conductive and electrically insulating, and can be disposed between the stacked chips without causing a short circuit.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A thermally conductive, electrically insulating composite film, comprising:
    a metal substrate;
    interface layers disposed on the top surface and the bottom surface of the metal substrate, respectively;
    a corresponding first insulation layer on each of the interface layers; and
    a composite layer disposed between each interface layer and corresponding insulation layer, wherein the composite layer comprises a diamond like carbon layer and a second insulation layer.

2. The composite film as claimed in claim 1, wherein the metal substrate comprises aluminum or copper.

3. The composite film as claimed in claim 1, wherein the metal substrate has a thickness of 10 μm to 200 μm.

4. The composite film as claimed in claim 1, wherein the interface layer comprises aluminum or aluminum nitride.

5. The composite film as claimed in claim 1, wherein the interface layer has a thickness of 20 nm to 100 nm.

6. The composite film as claimed in claim 1, wherein the first insulation layer comprises aluminum oxide or aluminum nitride.

7. The composite film as claimed in claim 1, wherein the first insulation layer has a thickness of 20 nm to 2 μm.

8. The composite film as claimed in claim 1, wherein the diamond like carbon layer comprises pure carbon or tetragonal amphormous carbon doped with hydrogen, nitrogen, or metal atoms.

9. The composite film as claimed in claim 1, wherein the diamond like carbon layer has a thickness of 100 nm to 10 μm.

10. The composite film as claimed in claim 1, wherein the second insulation layer comprises aluminum oxide or aluminum nitride.

11. The composite film as claimed in claim 1, wherein the second insulation layer has a thickness of 20 nm to 2 μm.

12. A stack chip package structure, comprising:
    a carrier substrate;
    a plurality of vertically stacked chips disposed on the carrier substrate, wherein the chips have contact holes; and
    a composite film disposed between the chips and/or between the chips and the carrier substrate;
    wherein the contact holes and the carrier substrate are connected by bumps, and the bumps contact the composite film,
    wherein the composite film comprises:
        a metal substrate;
        interface layers disposed on the top surface and the bottom surface of the metal substrate, respectively; and
        a corresponding first insulation layer on each of the interface layers.

13. The stack chip package structure as claimed in claim 12, further comprising a circuit board connected to the carrier substrate by solder balls.

14. The stack chip package structure as claimed in claim 12, further comprising a thermal dissipation component on the top or the sidewall of the stack chip package structure.

15. The stack chip package structure as claimed in claim 14, wherein the thermal dissipation component comprises fan, heat pipe, or combinations thereof.

16. The stack chip package structure as claimed in claim 12, further comprising a composite layer disposed between each interface layer and corresponding insulation layer, wherein the composite layer comprises a diamond like carbon layer and a second insulation layer.

17. The stack chip package structure as claimed in claim 16, wherein the diamond like carbon layer comprises pure carbon or tetragonal amphormous carbon doped with hydrogen, nitrogen, or metal atoms.

18. The stack chip package structure as claimed in claim 16, wherein the diamond like carbon layer has a thickness of 100 nm to 10 μm.

19. The stack chip package structure as claimed in claim 16, wherein the second insulation layer comprises aluminum oxide or aluminum nitride.

20. The stack chip package structure as claimed in claim 16, wherein the second insulation layer has a thickness of 20 nm to 2 μm.

* * * * *